United States Patent

Shoaei et al.

[11] Patent Number: 6,140,868
[45] Date of Patent: Oct. 31, 2000

[54] MASTER TUNING CIRCUIT FOR ADJUSTING A SLAVE TRANSISTOR TO FOLLOW A MASTER RESISTOR

[75] Inventors: Omid Shoaei; Zhi-Long Tang, both of Allentown, Pa.

[73] Assignee: Lucent Technologies, Inc., Murray Hill, N.J.

[21] Appl. No.: 09/264,727

[22] Filed: Mar. 9, 1999

[51] Int. Cl.[7] ........................................................ G06G 7/26
[52] U.S. Cl. ........................... 327/561; 327/538; 330/282
[58] Field of Search .................................. 327/561, 562, 327/538, 540, 541, 543; 330/86, 282

[56] References Cited

U.S. PATENT DOCUMENTS

| | | | |
|---|---|---|---|
| 5,651,073 | 7/1997 | Isu et al. | 381/108 |
| 5,973,551 | 10/1999 | Mitsuda | 327/543 |

*Primary Examiner*—Tuan T. Lam
*Assistant Examiner*—Linh Nguyen
*Attorney, Agent, or Firm*—Synnestvedt & Lechner LLP

[57] ABSTRACT

A method and apparatus for adjusting the resistance across a slave transistor to follow a master resistor network are disclosed. A tuning circuit is disclosed which is used to control the effective resistance of a slave transistor for use in high speed integrated automatic gain control, equalizer, filter or equivalent types of circuits where low parasitic capacitance is desired. The invention provides a way to replace a resistor network and its associated high parasitic capacitance with an equivalent resistance having low parasitic capacitance. The invention replaces the resistor network, having large parasitic capacitance, with a slave transistor exhibiting an equivalent resistance, having low parasitic capacitance. An automatic tuning circuit containing a resistor network is located remotely to a circuit containing a slave transistor. The tuning circuit is then used to adjust the effective resistance of the slave transistor. The invention decreases unwanted parasitic capacitance, resulting in higher speed integrated automatic gain control, equalizer, filter and equivalent types of circuits.

13 Claims, 5 Drawing Sheets

MASTER TUNING CIRCUIT FOR ADJUSTING A SLAVE TRANSISTOR TO FOLLOW A MASTER RESISTOR

FIELD OF THE INVENTION

The present invention relates to a novel and useful method for reducing the parasitic capacitance in integrated automatic gain control (AGC), equalizer, filter and similar types of circuits.

BACKGROUND OF THE INVENTION

Integrated automatic gain control (AGC), equalizer, filter and similar types of circuits can use an operational amplifier with resistance and capacitance in a feedback loop and a feed forward path to generate a desired transfer function. FIG. 1 illustrates a simple amplifier of the prior art in which the gain can be approximated by dividing the resistance in the feedback loop, $R_{fb}$, by the resistance in the feed forward path, $R_{ff}$. FIG. 2 depicts a simple gain stage in which the single feedback loop resistor, $R_{fb}$, of FIG. 1 is replaced by a resistor network that can change the resistance in the feedback loop by manipulating switches $s_1$ through $s_n$. The gain or attenuation of the amplifier in FIG. 2 can be changed by switching combinations of feedback resistors in or out, thereby making an automatic gain control (AGC) circuit.

A problem with circuits like the one shown in FIG. 2 is that resistors in semiconductors are limited to diffusion or poly silicon resistors. It is well known that the abovementioned resistors have associated parasitic capacitances to the substrate. Parasitic capacitance adversely affects the performance of high speed circuits. The parasitic capacitance introduced into a circuit by each resistor can be modeled as a three terminal device with the third terminal usually being the substrate. The parasitic capacitance of integrated resistors can be modeled as shown in FIG. 3. FIG. 3 shows a symbol of a resistor with a desired value of resistance, R, and an undesired value of parasitic capacitance, $C_p$, to the substrate.

The parasitic capacitance of the AGC circuit in FIG. 2 is included in the FIG. 4 model of the AGC circuit. In the model integrating parasitic capacitance, parasitic capacitor $C_{p1}$ is added to the middle of feed forward resistor $R_1$, which represents the feedforward resistor, R, from FIG. 2; and parasitic capacitor $C_{p2}$ is added to the middle of feedback resistor $R_2$, which represents the feedback loop resistor network, $R_{1f}$ through $R_{nf}$, from FIG. 2. Ideally, the transfer function of the amplifier would be $v_o/v_i = -R_2/R_1$. However, incorporating the parasitic capacitance results in the transfer function being represented by $$\frac{v_o}{v_i} = -\frac{2R_2 + R_2^2 C_{P2} s}{2R_1 + R_1^2 C_{P1} s} \quad (1)$$

where s represents the Laplace frequency component of the circuit. From equation 1, it is apparent that an unwanted zero and an unwanted pole are introduced to the system by the parasitic capacitances, as shown in equation 2.

$$z_1 = \frac{-1}{(R_2/2)C_{P2}}, \quad p_1 = \frac{-1}{(R_1/2)C_{P1}} \quad (2)$$

As the gain increase, i.e., as $R_2$ is increased, $C_{P2}$ increases compared to $C_{P1}$, causing the zero to become smaller compared to the pole. This results in unwanted peaking in the frequency domain and is depicted in FIG. 5.

Another source of parasitic capacitance in integrated circuits arises from the switches used in the circuit to adjust the amount of resistance in the feedback loop. The switches are generally NMOS transistors or composite NMOS and PMOS T-gates. The NMOS transistors and T-gates add capacitance to the circuit, due to a physical overlap between the drain-gate and the source-gate of integrated circuit transistors. Additionally, capacitance is added by reverse bias diodes which are used in NMOS and composite switches.

Another well-known approach used to create AGC circuits is shown in FIG. 6. The circuit in FIG. 6 allows the use of much smaller resistors in the feedback loop than the circuit depicted in FIG. 2 for equivalent levels of gain. This circuit uses a T-network resistor in the feedback loop instead of the single resistor path shown in FIG. 1. The gain for this circuit is approximated in the following equation:

$$\frac{v_o}{v_i} = -\frac{2R_2 + \frac{R_2^2}{R_3}}{R_1} \quad (3)$$

This approach allows the use of smaller resistors in the feedback loop by using the 1/x relationship between the value of resistor $R_3$ and the gain of the circuit in FIG. 6. The gain of the AGC can be changed by varying $R_3$, with the gain increasing as the resistance of resistor R3 decreases. The T-network resistors, $R_2$ and $R_3$, shown in FIG. 6 can be much smaller that the feedback resistor $R_{fb}$ shown in FIG. 1 for a given amount of gain. However, there is a limit for lowering $R_2$ and $R_3$, since the maximum gain occurs when $R_3$ is at a minimum. Therefore, an amplifier has to be able to drive a low resistor load equal to resistor $R_2/2$ plus resistor $R_2/2$ in parallel with resistor $R_3$. This results in a tradeoff between lowering the feedback resistors and increasing the amplifier power to handle a low resistive load.

Assuming that the amplifier can drive a low resistive load, using resistors with low resistance for $R_2$ and $R_3$ and choosing to have the same number of resistance settings as the circuit shown in FIG. 2, the steps of the $R_3$ resistor string must be very small. In order to keep the net transfer function accurate, the resistance of the switches has to be much smaller than each resistance step. This means that very large NMOS transistors or T-gates for switches are required, which results in additional parasitic capacitance. Also, because the gain varies with $R_3$ as a function of 1/x as shown in FIG. 7, precision is lost as the resistance becomes very small due to small changes in resistance resulting in very large changes in gain.

SUMMARY

The present invention provides an improved apparatus and method for adjusting the effective resistance between the drain and source of a remotely located transistor (or equivalently the collector and emitter of a bipolar transistor) to mimic the resistance of a resistor network. By replacing a resistor network in an integrated circuit with a slave transistor which has an equivalent effective resistance and placing a master resistor network for controlling the transistor's effective resistance in a remote location, the amount of parasitic capacitance in integrated automatic gain control (AGC), equalizer, filter, or similar type circuits can be reduced. By reducing the parasitic capacitance, more accurate, higher speed integrated circuits can be developed.

The present invention can be incorporated into existing integrated circuit designs by replacing resistor networks with controlled slave transistors having the same effective resistance. The slave transistor can be adjusted with a tuning circuit that generates a voltage at the gate of a transistor (or equivalently the base of a bipolar transistor), whereby the resistance across the drain and source of the slave transistor is tuned to a scaled equivalent resistance of the resistor network located in the tuning circuit. Due to the entire tuning circuit being located remotely to the slave transistor, any parasitic capacitances which are introduced in the tuning circuit will not affect the performance of the circuit containing the slave transistor.

The tuning circuit is designed so that a resistor network such as the resistor network depicted by $R_3$ in FIG. 6 can be used by the tuning circuit to create an effective resistance between the drain and source of a master transistor in the tuning circuit, where the master transistor is being controlled at its gate by the output of an amplifier. The $R_3$ resistor network, such as depicted in FIG. 6, is then replaced with a slave transistor having a scaled relationship to the master transistor in the tuning circuit. The slave transistor acts as a variable resistor which is driven at its gate by a voltage derived from the voltage being impressed at the gate of the master transistor in the tuning circuit. Since the characteristics of the master and slave transistors have a scaled relationship and the voltage levels being impressed at their gates have a scaled relationship, the effective resistance between the drain and source for a given voltage can be determined, resulting in the slave transistor having a scaled effective resistance of the $R_3$ resistor network located in the tuning circuit. By remotely locating the tuning circuit, resistor networks with their associated large parasitic capacitances can be used without affecting the frequency response of the circuit. Although the slave transistor will introduce a certain amount of parasitic capacitance, a circuit containing a slave transistor in accordance with the present invention will contain much less capacitance than prior art circuits.

DETAILED DESCRIPTION OF THE INVENTION

Figure 1:
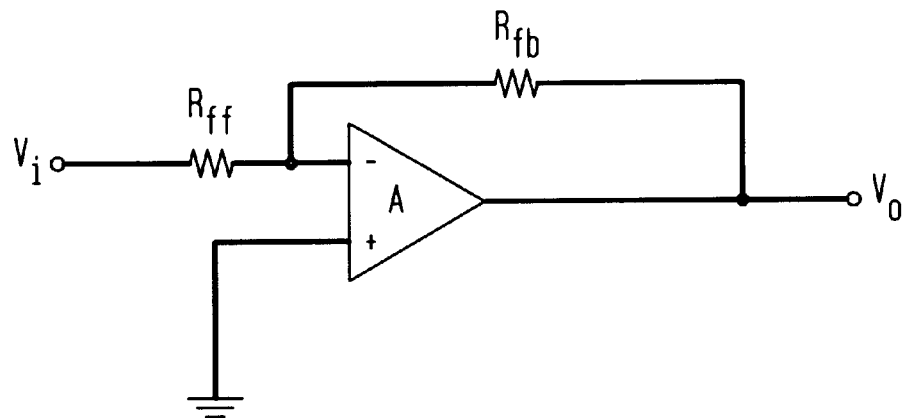
FIG. 1 is a circuit diagram of an amplifier circuit in accordance with the prior art.
Figure 2:
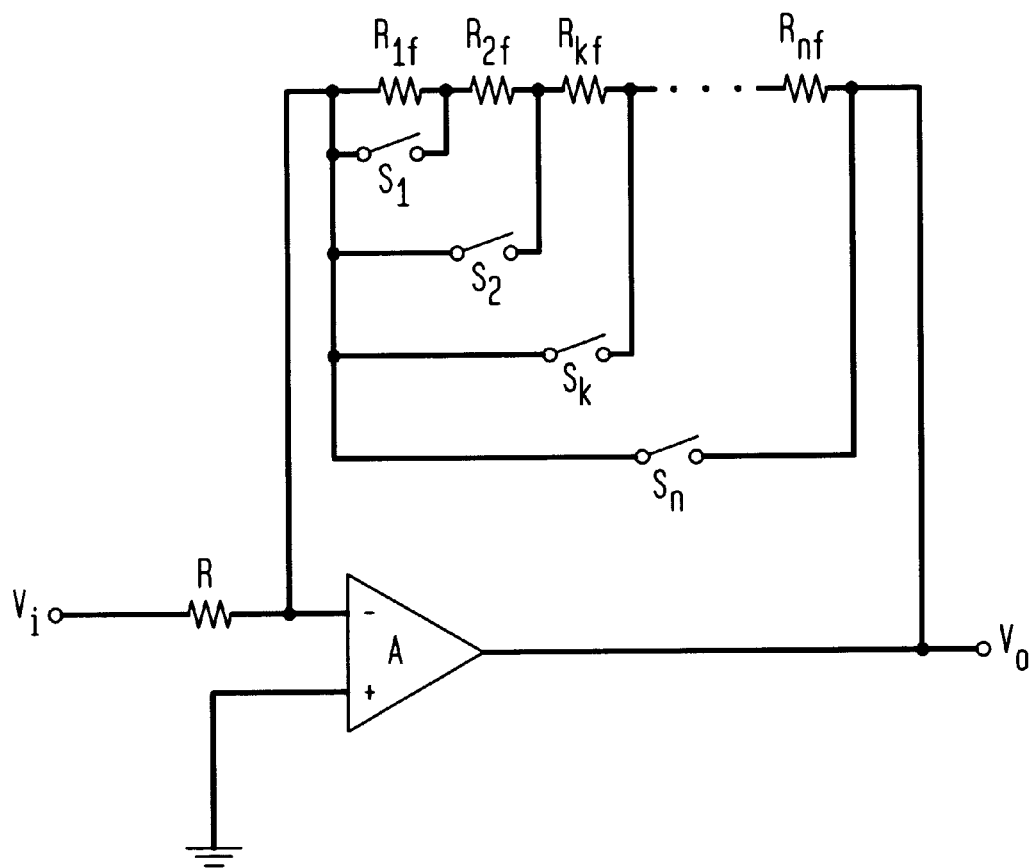
FIG. 2 is a circuit diagram of an automatic gain control (AGC) circuit in accordance with the prior art.
Figure 3:
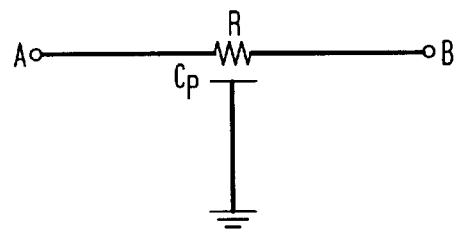
FIG. 3 is a circuit diagram of a model which can be used to model the parasitic capacitance associated with a resistor in an integrated circuit.
Figure 4:
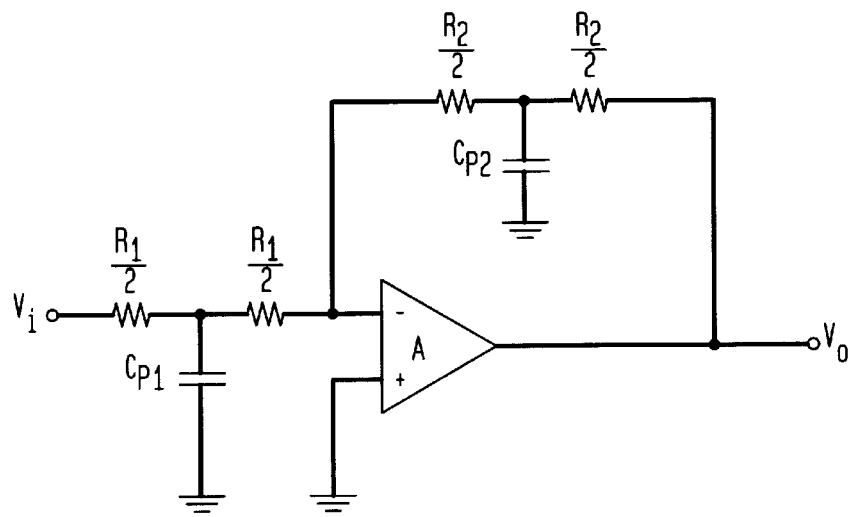
FIG. 4 is a circuit diagram of an amplifier illustrating parasitic capacitance in accordance with the prior art.
Figure 5:
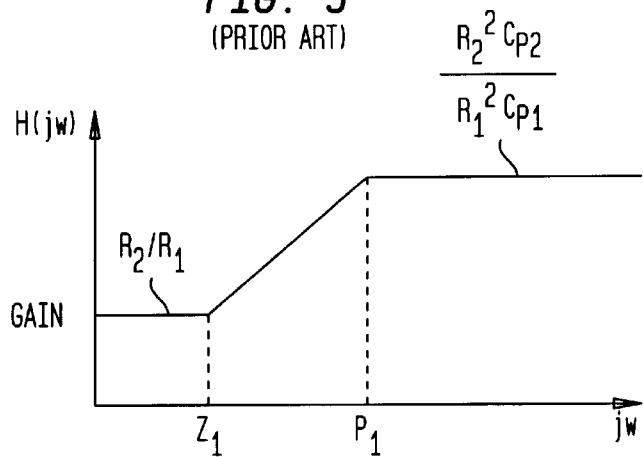
FIG. 5 is a graph of the unwanted zero and pole introduced by unwanted capacitance in accordance with the prior art.
Figure 6:
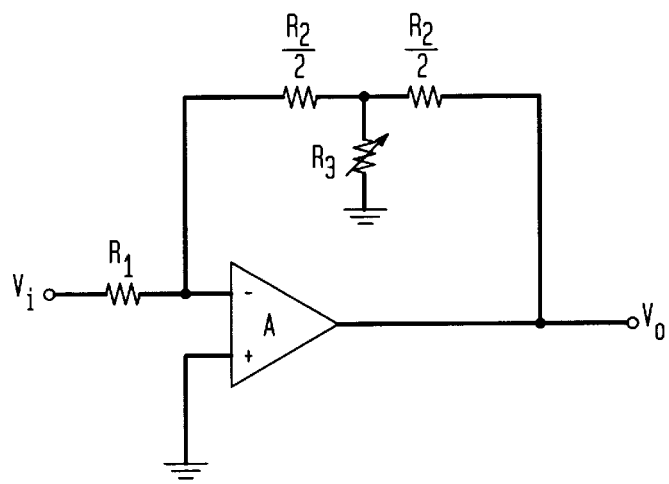
FIG. 6 is a circuit diagram of an AGC circuit in accordance with the prior art.
Figure 7:
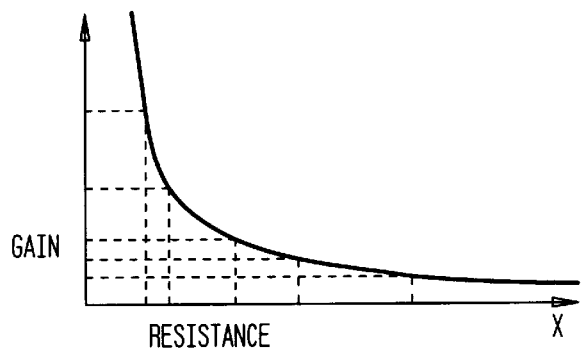
FIG. 7 is a graph of the 1/x relationship of the gain to resistance of the circuit depicted in FIG. 6.
Figure 8:
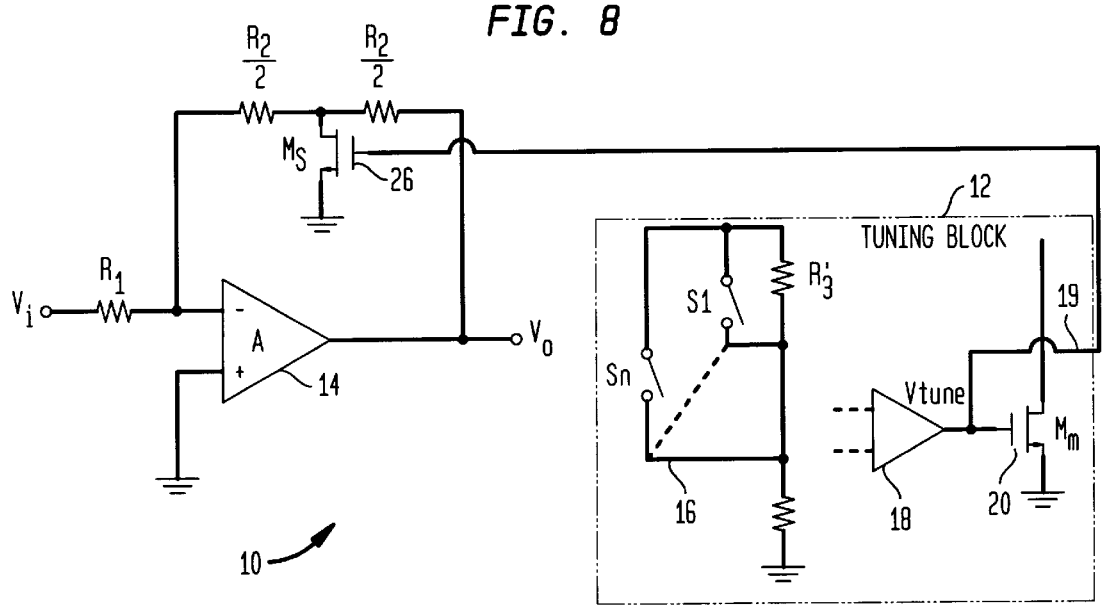
FIG. 8 is a circuit diagram of an AGC circuit with the feedback resistance being controlled by a tuning circuit in accordance with the present invention.

Referring more particularly to the drawings, FIG. 8 depicts an automatic gain control circuit incorporating the present invention. In circuit 10, the resistor $R_3$ from FIG. 6 is replaced with slave transistor 26 attached to tuning block 12. The tuning block 12 contains a resistor network 16, an amplifier 18, and a master transistor 20. Within the tuning block 12, a resistance across resistor network 16 is sensed and the amplifier 18 attempts to force an equivalent resistance across the drain-source terminals of master transistor 20 (or equivalently the collector-emitter of a bipolar transistor). The voltage on line 19 that amplifier 18 uses to control the gate of master transistor 20 (or equivalently the base of a bipolar transistor) is also used to control the voltage at the gate of slave transistor 26. By using identical transistors for the master transistor 20 and the slave transistor 26, and setting the voltage level at their respective gates equal, the resistance across the drain-source of each transistor will be equivalent. Therefore, the resistance across the drain-source of the slave transistor will equal the resistance in the resistor network 16. The present invention allows resistor network 16, which has high associated parasitic capacitance, to be remotely located and replaced in amplifier 14 by slave transistor 26, which has low parasitic capacitance.

Figure 9:
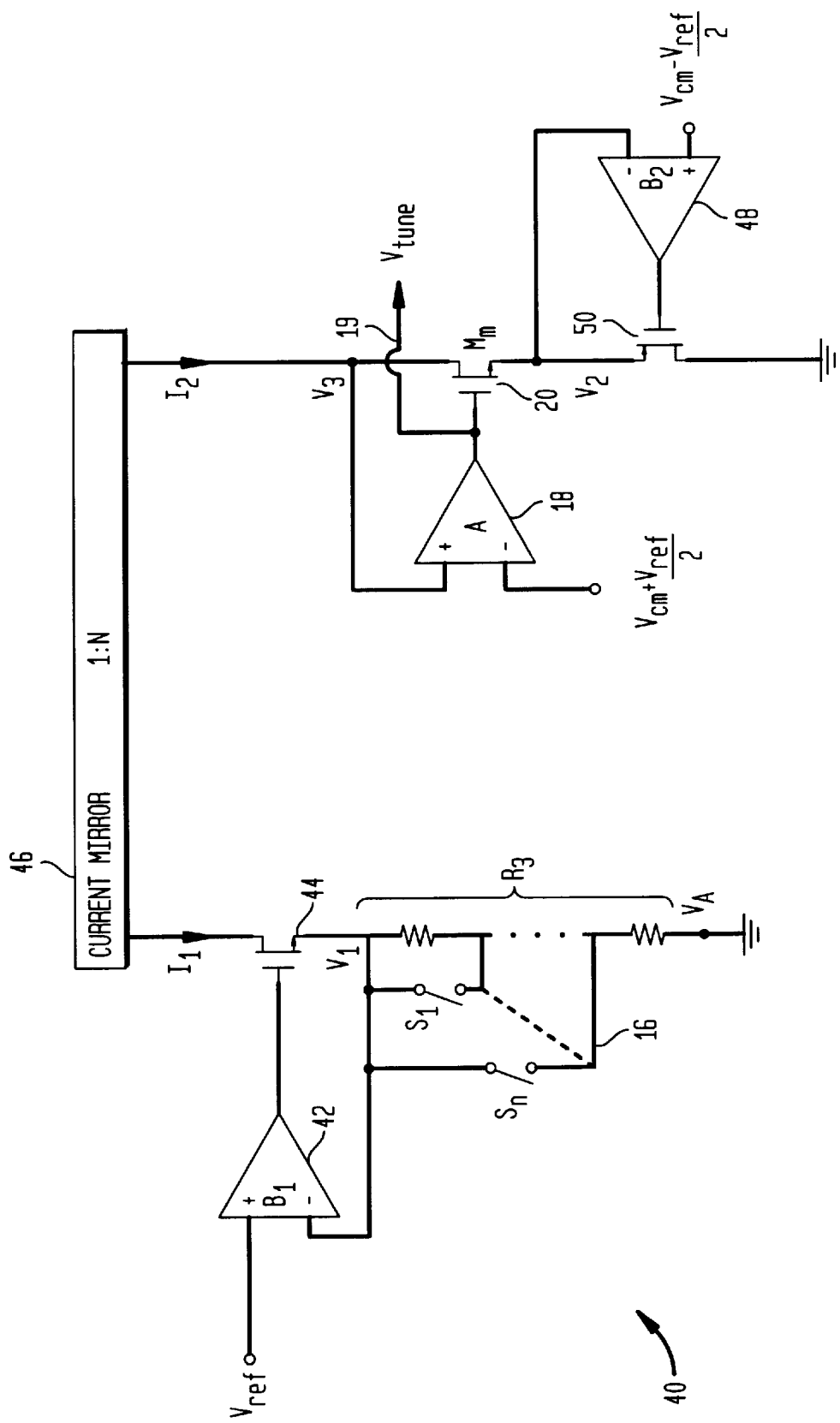
FIG. 9 is a circuit diagram of a tuning circuit in accordance with an embodiment of the present invention.

In a preferred embodiment of the invention, a tuning circuit is constructed as shown in FIG. 9. The function of circuit 40 is to mirror the resistance of resistor network 16 as an effective resistance across the drain-source of master transistor 20. The voltage which is used to control the gate of master transistor 20 is also used to control the gate of a slave transistor which is located remotely, whereby the effective drain-source resistance of master transistor 20 and the effective drain-source resistance of the slave transistor 26 will be the same, provided the master and slave transistors are identical. Thus, the slave transistor can be regulated to have the same effective resistance as the remotely located resistor network 16. In other words, the resistor network 16 and its associated high parasitic capacitance can be located remotely and a transistor with a low level of parasitic capacitance can be used in an AGC or similar type of circuit, providing improved speed and linearity.

In circuit 40, buffer amplifier 42 is used to force the voltage across the resistor network 16 to equal a known reference voltage, $V_{ref}$, by incorporating the voltage level at the non ground end of the resistor network into a feedback loop. The buffer amplifier 42 regulates the voltage across the resistor network 16 by controlling the gate of transistor 44, which regulates the drain-source current of transistor 44 and equivalently the current through the resistor network 16, whereby the reference voltage, $V_{ref}$, is impressed across the resistor network 16. The current $I_1$ through the resistor network 16 and equivalently through the drain-source of transistor 44 can be calculated using the following equation:

$$I_1 = \frac{V_{ref}}{R_3} = \frac{v_1}{R_3} \qquad (4)$$

The current $I_2$ through master transistor 20 is then developed using a current mirror 46 to set the current $I_2$ equal to N times current $I_1$. For the present circuit 40, it is desirable for N to equal one so that current $I_2$ equals current $I_1$.

The voltage at the drain of transistor 20 is then set equal to the common mode voltage plus one-half the reference voltage by using amplifier 18 to control the gate of transistor 20. The voltage level at the source of transistor 20 is set to equal the common mode voltage less one-half the reference voltage by using buffer amplifier 48 to control the gate of transistor 50 thereby controlling the voltage level at the source of transistor 50 and equivalently at the source of transistor 20. The voltage level across the master transistor 20 can be calculated by subtracting the voltage at the source of master transistor 20 from the voltage level at the drain of transistor 20 as shown in equation 5.

$$\left(V_{cm} + \frac{V_{ref}}{2}\right) - \left(V_{cm} - \frac{V_{ref}}{2}\right) = V_{ref} \qquad (5)$$

The effective resistance across the drain-source of transistor 20 can then be calculated by dividing the voltage, $V_{ref}$, by the current $I_2$ or equivalently current $I_1$, resulting in a mirror of the resistance of resistor network 16 across the drain-source of master transistor 20.

The voltage developed at the output of amplifier 18 to control the gate of master transistor 20 is also used to control the gate of remotely located slave transistor 26. Assuming that the master transistor 20 and the slave transistor 26 are identical, impressing the same voltage at their respective gates will result in an equivalent effective resistance between the drain and source of master transistor 20 and slave transistor 26. Since the effective resistance of master transistor 20 is equal to the resistance across the resistor network 16, the resistance across the remotely located slave transistor 26 will equal the resistance across the master resistor network 16.

Figure 10:
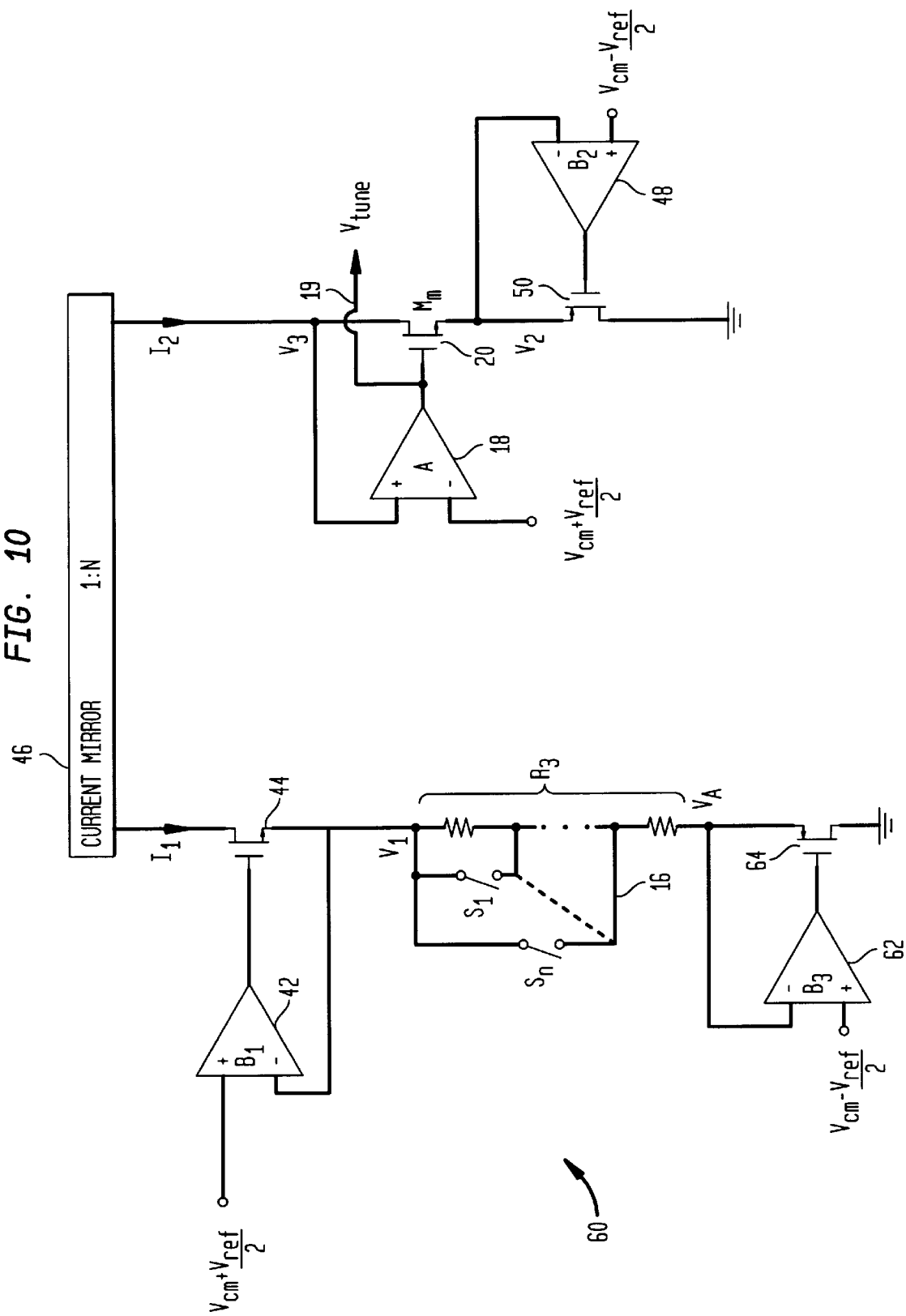
FIG. 10 is a circuit diagram of a tuning circuit in accordance with an alternative embodiment of the present invention.

In another embodiment of the present invention, an additional buffer amplifier 62 and transistor 64 are added to the tuning circuit as depicted in FIG. 10. The additional buffer is used to ensure that the voltage being impressed across the resistor network 16 is equal to $V_{ref}$, and does not contain any error due to a voltage drop across the trace between the ground node of resistor network 16 and the ground pad of circuit 60, represented by $V_A$. Although the trace can be made wide in the circuit layout to avoid any deterministic error, the trace effects can also be removed by adding buffer amplifier 62 and transistor 64, as shown in FIG. 10. The voltage across resistor network 16 is set using buffer amplifier 42 to force the voltage at one end of the resistor network 16 to equal the common mode voltage plus one-half of a reference voltage, $V_{ref}$, by controlling the gate of transistor 44 and using buffer amplifier 62 to force the voltage at the other end of the resistor network to equal the common mode voltage less one-half the reference voltage by controlling the gate of transistor 64. The calculation of the voltage across resistor network 16 is the same as equation 5 in the first preferred embodiment.

For facilitation of discussion, reference current 12 developed through current mirror 46 was set to equal current $I_1$. However, current mirror 46 can be designed to scale current $I_1$ in creating current $I_2$. Also, the voltage level impressed at the gates of the master and slave transistors can be scaled by intermediate circuitry in contrast to the identical voltages developed in the discussion of the preferred embodiments. Further, although master transistor 20 was described to have the same characteristics as slave transistor 26, these transistors can be related such that the effective resistance across slave transistor 26 is a scaled version of the effective resistance across master transistor 20. The values chosen for scaling the current, voltage and effective resistance will depend on the desired operating characteristics of tuning circuit 12 and the characteristics of the circuit containing slave transistor 26.

In addition, field effect transistors are shown in the figures and used to describe the preferred embodiments, however, the present invention may incorporate field effect transistors (FETs), bipolar junction transistors (BJTs) or a combination of FETs and BJTs. Therefore, the terminology used in the claims will be as follows: the gate in a FET and the base in a BJT will be referred to as the control terminal of the transistor, and the drain-source terminals of a FET and the collector-emitter terminals of a BJT will be referred to as the current flow terminals of the transistor.

Conclusion

Having thus described a few particular embodiments of the invention, various alterations, modifications, and improvements will readily occur to those skilled in the art. Such alterations, modifications and improvements as are made obvious by this disclosure are intended to be part of this description though not expressly stated herein, and are intended to be within the spirit and scope of the invention. Accordingly, the foregoing description is by way of example only, and not limiting. The invention is limited only as defined in the following claims and equivalents thereto.

What is claimed is:

1. A method for tuning a slave transistor to have an effective resistance that follows a master resistor comprising:

sensing a resistance across said master resistor;

developing a first effective resistance across the current flow terminals of a master transistor equivalent to said resistance across said master resistor by controlling the control terminal of said master transistor; and attaching the control terminal of said slave transistor to the control terminal of said master transistor, whereby a second effective resistance is created across the current flow terminals of said slave transistor which is related to the resistance across said master resistor.

2. A method in accordance with claim 1, wherein said second effective resistance of said slave transistor and said resistance across said master resistor are equal.

3. A method in accordance with claim 1, wherein said slave transistor and said master transistor have identical characteristics.

4. A master circuit for tuning a slave transistor to follow a master resistor comprising;

a master resistor;

a first amplifier coupled to apply a first reference potential across said master resistor, whereby a first reference current is created;

a current mirror coupled to receive said first reference current, whereby a second reference current is created;

a master transistor, coupled to said second reference current such that said second reference current flows through current flow terminals of said master transistor;

a second and a third amplifier coupled across the current flow terminals of said master transistor to apply a second reference potential, wherein said second amplifier or said third amplifier controls the control terminal of said master transistor to adjust the effective resistance across the current flow terminals of said master transistor; and a slave transistor, wherein the control terminal of said slave transistor is coupled to the control terminal of said master transistor, whereby the effective resistance across the current flow terminals of said master transistor and the effective resistance across current flow terminals of said slave transistor are related.

5. A master circuit in accordance with claim 4, wherein said first reference potential and said second reference potential are equal.

6. A master circuit in accordance with claim 4, wherein said effective resistance of said slave transistor and said resistance of said master resistor are equal.

7. A master circuit in accordance with claim 4, wherein said slave transistor and said master transistor have identical characteristics.

8. A master circuit in accordance with claim 4, wherein said first reference current and second reference current are equal.

9. A master circuit for tuning a slave transistor to follow a master resistor comprising;

- a first amplifier coupled to create a first reference potential;
- a second amplifier coupled to create a second reference potential;
- a master resistor; coupled between said first and second reference potentials, whereby a first reference current is created;
- a current mirror coupled to receive said first reference current, whereby a second reference current is created;
- a master transistor, coupled to said second reference current such that said second reference current flows through current flow terminals of said master transistor;
- a third and a fourth amplifier coupled across the current flow terminals of said master transistor to apply a third reference potential, wherein said third amplifier or said fourth amplifier controls the control terminal of said master transistor to adjust the effective resistance across current flow terminals of said master transistor; and
- a slave transistor, wherein the control terminal of said slave transistor is coupled to the control terminal of said master transistor, whereby the effective resistance across the current flow terminals of said master transistor and the effective resistance across current flow terminals of said slave transistor are related.

10. A master circuit in accordance with claim 9, wherein said third reference potential is equal to the difference between said first reference potential and said second reference potential.

11. A master circuit in accordance with claim 9, wherein said effective resistance of said slave transistor and said resistance of said master resistor are equal.

12. A master circuit in accordance with claim 9, wherein said slave transistor and said master transistor have identical characteristics.

13. A master circuit in accordance with claim 9, wherein said first reference current and second reference current are equal.

* * * * *